United States Patent
Chebrolu et al.

(10) Patent No.: US 11,275,139 B1
(45) Date of Patent: Mar. 15, 2022

(54) SYSTEM AND METHOD FOR AUTOMATED IDENTIFICATION OF SPECTRAL CHARACTERISTICS

(71) Applicant: Siemens Healthcare GmbH, Erlangen (DE)

(72) Inventors: Venkata Veerendranadh Chebrolu, Rochester, MN (US); Peter Kollasch, Minnetonka, MN (US); Michael Wullenweber, Erlangen (DE); Andreas Schäfer, Fürth (DE); Johann Sukkau, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/322,107

(22) Filed: May 17, 2021

Related U.S. Application Data

(60) Provisional application No. 63/162,179, filed on Mar. 17, 2021.

(51) Int. Cl.
  *G01R 33/483* (2006.01)
  *G01R 33/56* (2006.01)
  *G01N 21/47* (2006.01)

(52) U.S. Cl.
  CPC ....... *G01R 33/483* (2013.01); *G01N 21/4795* (2013.01); *G01R 33/5608* (2013.01)

(58) Field of Classification Search
  None
  See application file for complete search history.

(56) References Cited

U.S. PATENT DOCUMENTS 10,386,434 B2   8/2019   Sukkau et al.
2015/0285883 A1*  10/2015  Clark ................. G01R 33/5615
                                              324/309

OTHER PUBLICATIONS

Hu, Houchun Harry, et al. "ISMRM workshop on fat-water separation: insights, applications and progress in MRI." Magnetic resonance in medicine 68.2 (2012): 378-388.
Clauser, P., et al. "Fat saturation in dynamic breast MRI at 3 Tesla: is the Dixon technique superior to spectral fat saturation? A visual grading characteristics study" European radiology 24.9 (2014): 2213-2219.
Juchem, Christoph, and Robin A. de Graaf. "B0 magnetic field homogeneity and shimming for in vivo magnetic resonance spectroscopy." Analytical biochemistry 529 (2017): 17-29.
Bachrata, Beata, et al. "Simultaneous Multiple Resonance Frequency imaging (SMURF): Fat-water imaging using multi-band principles." Magnetic resonance in medicine 85.3 (2021): 1379-1396.
Crijns, S., et al. "WE-G-18C-07: Accelerated Water/fat Separation in MRI for Radiotherapy Planning Using Multi-Band Imaging Techniques." Medical Physics 41.6Part31 (2014): 530-530.

* cited by examiner

*Primary Examiner* — Rodney E Fuller

(57) ABSTRACT

Systems and methods for determining proton spectral characteristics associated with a pair of targets from an MRI data volume are provided. The methods can include identifying spectral widths and peak-to-peak distance associated with the targets from the MRI data volume. The targets could include water and fat. The identified proton spectral characteristics can be useful for accurate spectral fat saturation, improving dynamic shim routines, and optimizing bandwidth of radiofrequency pulses used in multi-slice or multi-band excitation.

15 Claims, 7 Drawing Sheets

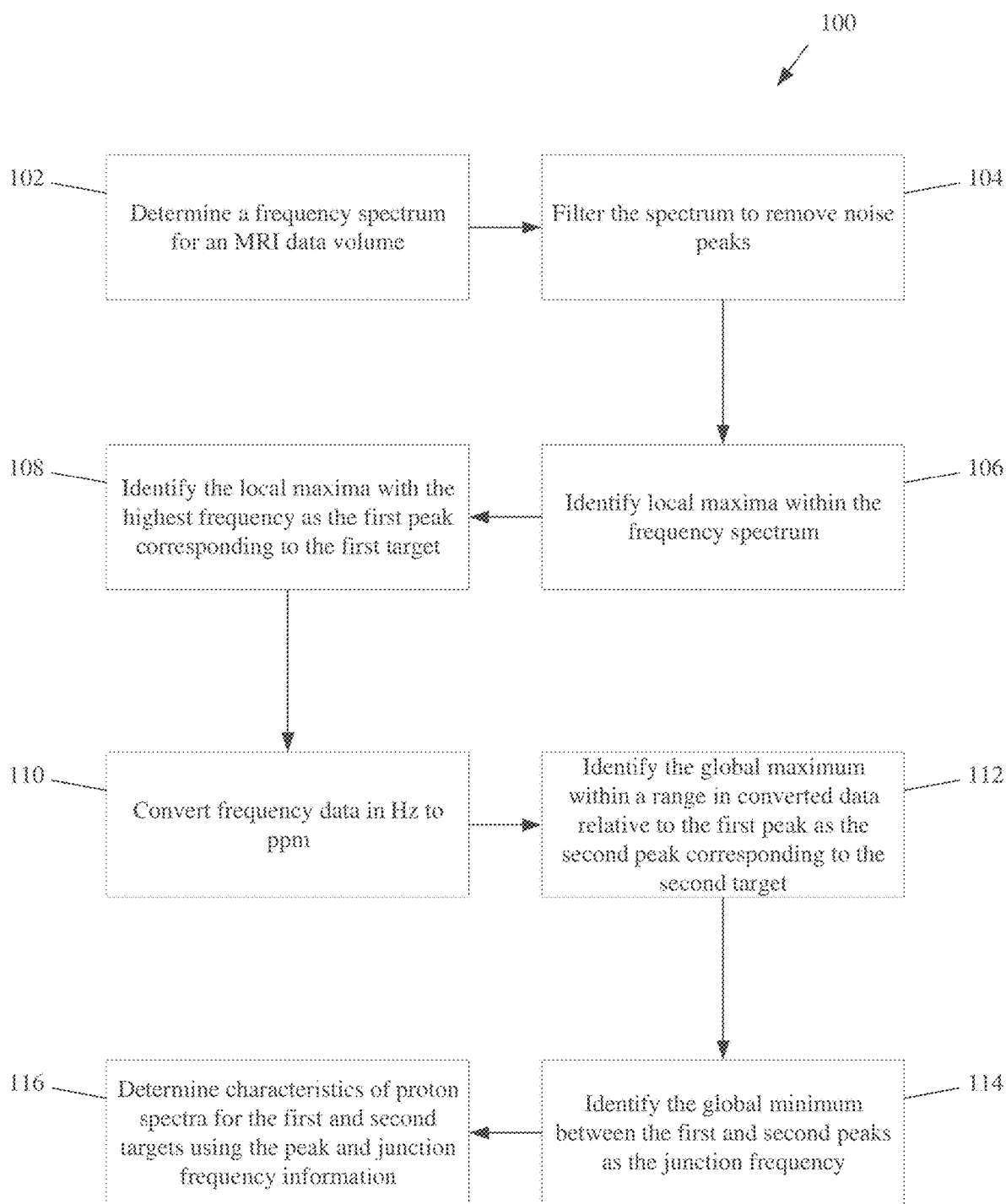

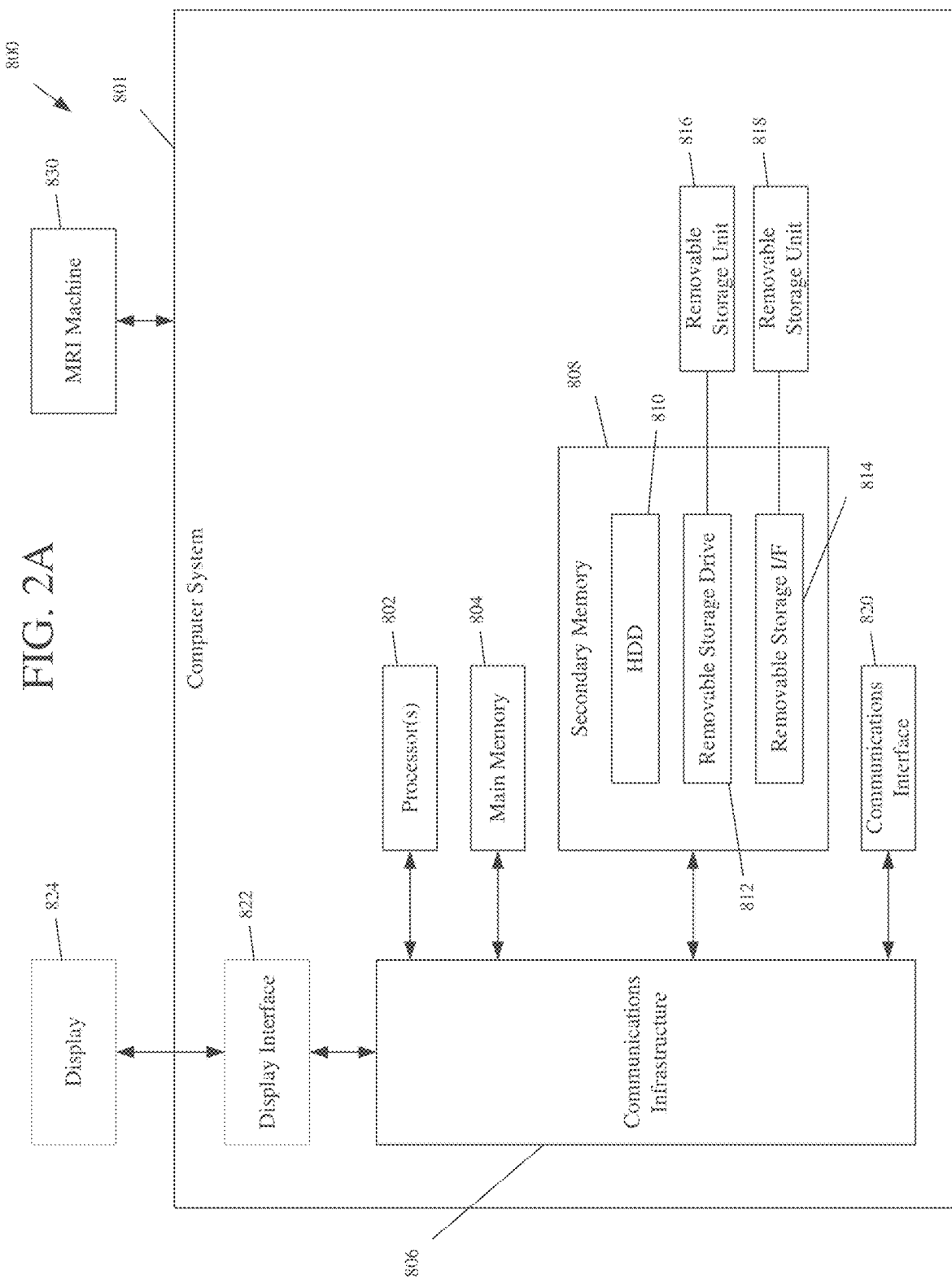

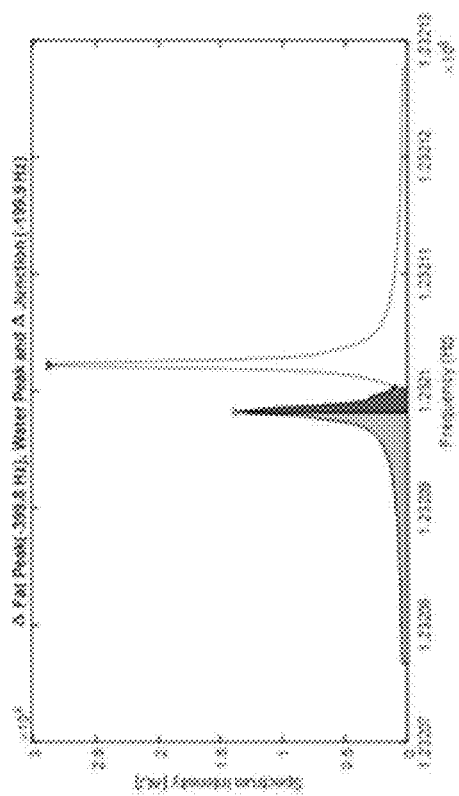
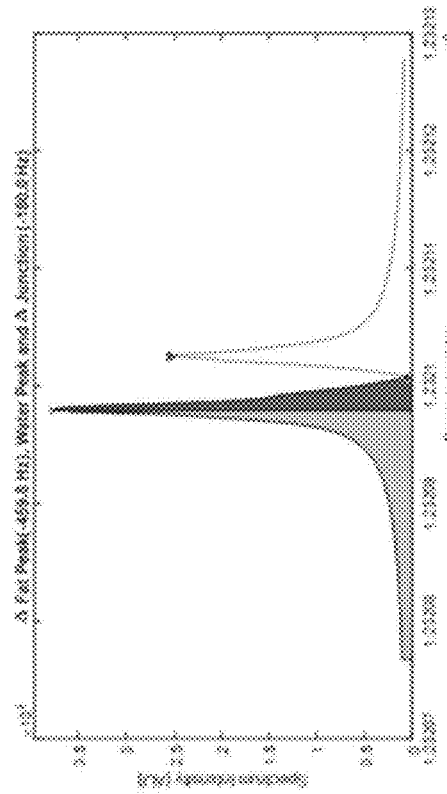
FIG. 3

FIG. 3 (CONT.)
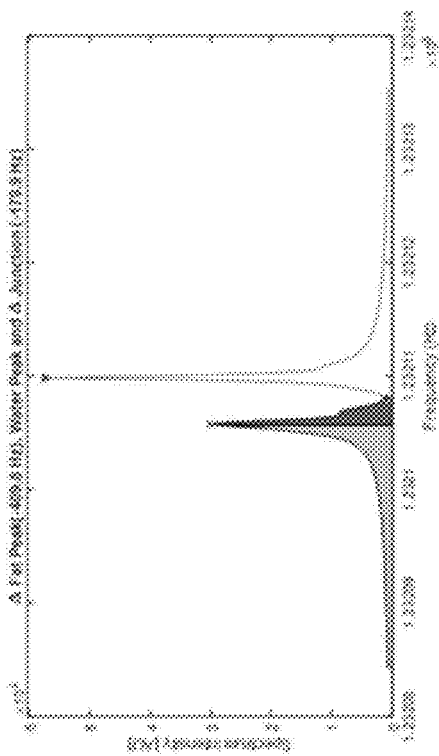
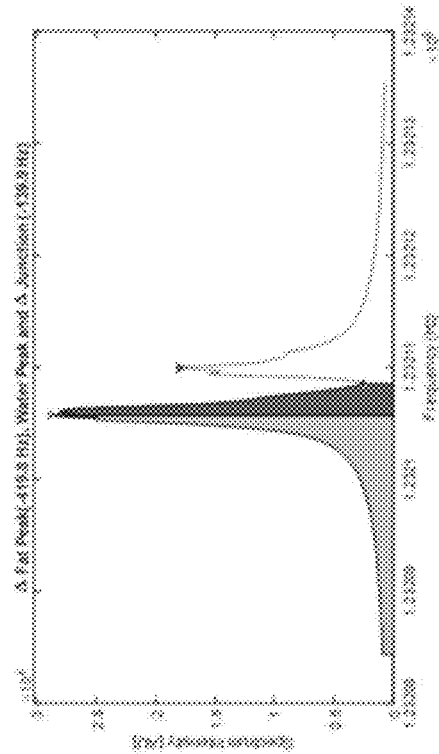

US 11,275,139 B1

SYSTEM AND METHOD FOR AUTOMATED IDENTIFICATION OF SPECTRAL CHARACTERISTICS

CROSS-REFERENCE TO RELATED APPLICATIONS

The present application claims priority to U.S. Provisional Patent Application No. 63/162,179, titled ALGORITHM FOR AUTOMATED IDENTIFICATION OF SPECTRAL CHARACTERISTICS, filed Mar. 17, 2021, which is hereby incorporated by reference herein in its entirety.

BACKGROUND

Proton spectral characteristics affect a wide range of magnetic resonance imaging (MRI)-based processes, including the accuracy of spectral fat saturation, dynamic shim routines, and the bandwidth of radiofrequency pulses used in multi-slice or multi-band excitation. Therefore, a technique for automatically determining the proton spectral characteristics for various targets, particularly water and fat, would be highly beneficial in order to improve the performance of the aforementioned processes. In particular, if one wants to suppress fat in an MR image, the fat bandwidth range needs to be known. Typically, fat is suppressed using saturated pulses; however, if the spectral characteristics of the fat are known (i.e., location of the fat in the frequency spectrum is known), then the pulse can be centered on the fat to improve the accuracy and performance of the pulse. Further, fat has multiple spectral peaks and some of the fat spectral peaks are very close to the water peak. Therefore, it is theoretically not possible to suppress all of the fat in an MR image, without also suppressing water. However, if the spectral characteristics of the fat are known, then saturation pulses and/or other MRI processing techniques can be specifically tailored for the fat in each specific instance. Currently, frequency shifts between water and fat protons can be analyzed on a voxel-by-voxel basis because the frequency shift is fixed when analyzing a single voxel. However, it would be advantageous to be able to analyze an entire 3D MRI image or MRI data volume as a whole, rather than on an individual voxel basis. However, when analyzing a 3D MRI image or MRI data volume as a whole, the frequency shift will no longer be fixed and, thus, one needs to account for this in the analysis. Accordingly, being able to automatically identify proton spectral characteristics from an MRI data volume as a whole (i.e., not on a voxel-by-voxel basis) would be highly beneficial in order to improve the accuracy of spectral fat saturation techniques, improve dynamic shim routines, and/or optimizing the bandwidth of radiofrequency pulses used in multi-slice or multi-band excitation, among other potential applications.

SUMMARY

Described herein are systems and methods for identifying proton spectral characteristics associated with various targets (e.g. water and fat) from an MRI data volume (i.e., a 3D MRI dataset).

In one embodiment, the present disclosure is directed to a computer-implemented method for determining proton spectral characteristics of a first target and a second target from an MRI data volume, the method comprising: determining, by a computer system, a frequency spectrum for the MRI data volume; identifying, by the computer system, local maxima within the frequency spectrum; identifying, by the computer system, the local maxima having a highest frequency as a first peak corresponding to the first target; converting, by the computer system, frequency data of the frequency spectrum to a unit independent of magnetic field strength; identifying, by the computer system, a global maximum within a range in the converted frequency data relative to the first peak as a second peak corresponding to the second target; identifying, by the computer system, a global minimum between the first peak and the second peak as the junction frequency; and determining, by the computer system, the proton spectral characteristics of the first target and the second target based on the identified first peak, the identified second peak, and the identified junction frequency.

In another embodiment, the present disclosure is directed to a computer system for determining characteristics of water and fat proton spectra for an MRI data volume, the computer system comprising: a processor; and a memory coupled to the processor, the memory storing instructions that, when executed by the processor, cause the computer system to: determine a frequency spectrum for the MRI data volume; identify local maxima within the frequency spectrum; identify the local maxima having a highest frequency as a first peak corresponding to the first target; convert frequency data of the frequency spectrum to a unit independent of magnetic field strength; identify a global maximum within a range in the converted frequency data relative to the first peak as a second peak corresponding to the second target; identify a global minimum between the first peak and the second peak as the junction frequency; and determine the proton spectral characteristics of the first target and the second target based on the identified first peak, the identified second peak, and the identified junction frequency.

In another embodiment, the present disclosure is directed to a computer readable medium storing instructions that, when executed by a processor, cause a computer system to: determine a frequency spectrum for the MRI data volume; identify local maxima within the frequency spectrum; identify the local maxima having a highest frequency as a first peak corresponding to the first target; convert frequency data of the frequency spectrum to a unit independent of magnetic field strength; identify a global maximum within a range in the converted frequency data relative to the first peak as a second peak corresponding to the second target; identify a global minimum between the first peak and the second peak as the junction frequency; and determine the proton spectral characteristics of the first target and the second target based on the identified first peak, the identified second peak, and the identified junction frequency.

FIGURES

The accompanying drawings, which are incorporated in and form a part of the specification, illustrate the embodiments of the invention and together with the written description serve to explain the principles, characteristics, and features of the invention. In the drawings:

FIG. 1 is a logic flow diagram of a process for identifying proton spectral characteristics from MRI data, in accordance with at least one aspect of the present disclosure.

FIG. 2A is a block diagram of a medical imaging system, in accordance with at least one aspect of the present disclosure.

DESCRIPTION

Figure 2B:
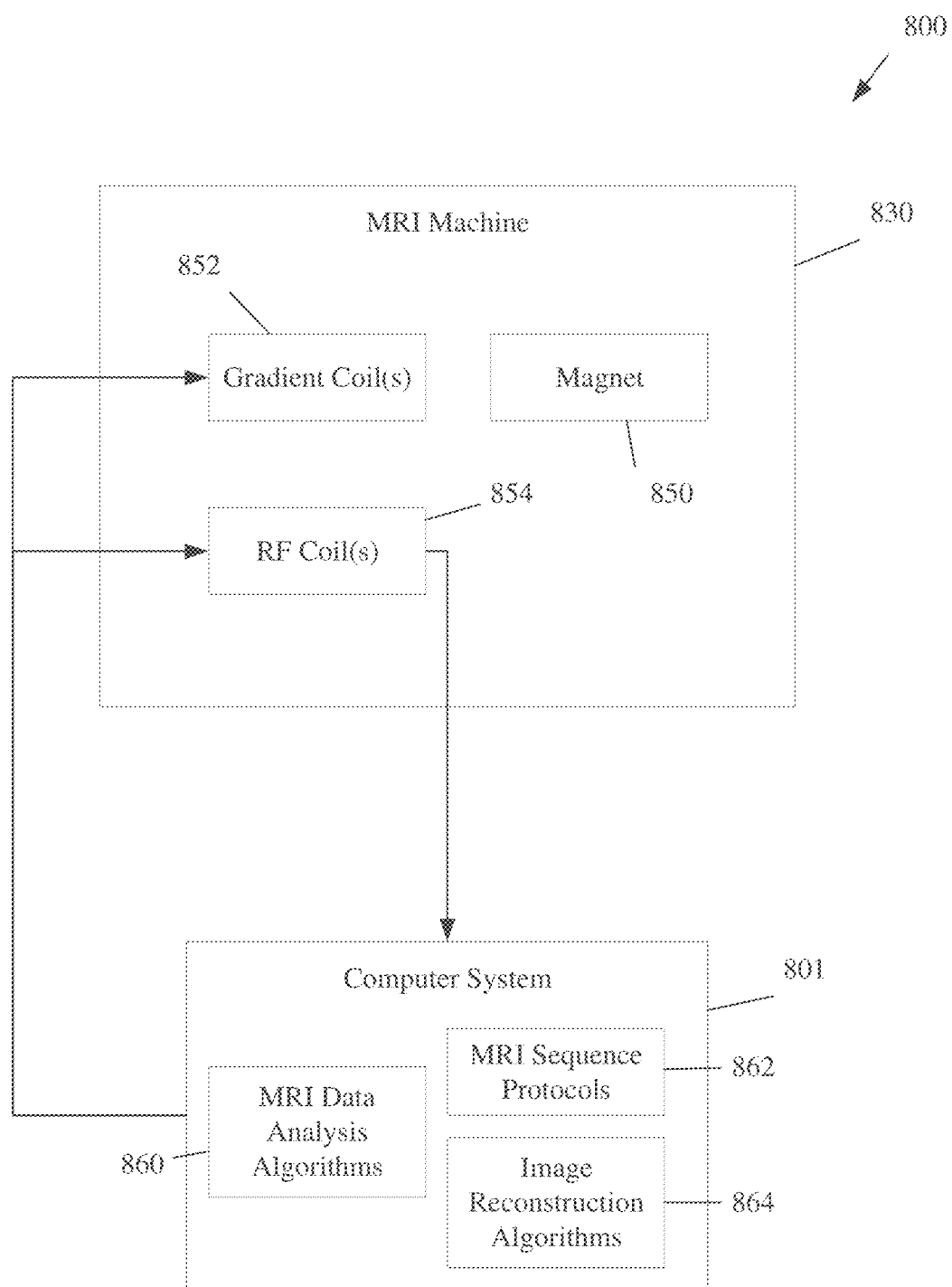
FIG. 2B is a second block diagram of the medical imaging system shown in FIG. 2A, in accordance with at least one aspect of the present disclosure.

This disclosure is not limited to the particular systems, devices and methods described, as these may vary. The terminology used in the description is for the purpose of describing the particular versions or embodiments only, and is not intended to limit the scope.

As used herein, the terms "algorithm," "system," "module," or "engine," if used herein, are not intended to be limiting of any particular implementation for accomplishing and/or performing the actions, steps, processes, etc., attributable to and/or performed thereby. An algorithm, system, module, and/or engine may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular algorithm, system, module, and/or engine is, unless otherwise specified, for purposes of convenience of reference and not intended to be limiting to a specific implementation. Additionally, any functionality attributed to an algorithm, system, module, and/or engine may be equally performed by multiple algorithms, systems, modules, and/or engines, incorporated into and/or combined with the functionality of another algorithm, system, module, and/or engine of the same or different type, or distributed across one or more algorithms, systems, modules, and/or engines of various configurations.

As used herein, the terms "MRI sequence," "pulse sequence," or "MRI pulse sequence" are interchangeable and can include a particular combination of pulse sequences and/or pulsed field gradients that result in a particular set of MRI data. An MRI sequence can be used either individually or in combination with one or more other MRI sequences (i.e., multi-parametric MRI).

As used herein, the term "MRI data" can include an MRI image or any other data obtained via MRI (e.g., biomarker data or a parameter map). An MRI image can include a three-dimensional image or a two-dimensional image (e.g., a slice of a three-dimensional image).

Automated Identification of Spectral Characteristics

Described herein are various processes and techniques for the automated identification of proton spectral characteristics from an MRI data volume (i.e., 3D MRI data). These processes analyze the MRI data volume as a whole, as opposed to on a voxel-by-voxel basis. The processes could be executed by a computer system associated with or communicably connected to a medical imaging system, such as the medical imaging system 800 described below. In various embodiments, the processes or individual steps thereof could be embodied as hardware, software, firmware, or various combinations thereof. In one embodiment, the processes could be embodied as instructions stored in a memory (e.g., the main memory 804 or the secondary memory 808 shown in FIG. 2A) coupled to a processor (e.g., the processor 802 shown in FIG. 2A) such that, when executed by the processor, the instructions cause computer system 801 to perform the described process. One example of a process for the identification of proton spectral characteristics is the process 100 illustrated in FIG. 1. Accordingly, the process 100 in FIG. 1 could be executed by the computer system 801 of the medical imaging system 800 described below.

Initially, the computer system 801 executing the process 100 receives an MRI data volume and determines 102 a frequency spectrum for the received MRI data volume. Notably, the process 100 analyzes the MRI data volume as a whole, rather than on a voxel-by-voxel basis as with conventional techniques for analyzing proton spectral characteristics associated with various targets (e.g., water and fat). In one embodiment, the computer system 801 can further filter 104 the spectrum to remove noise and/or noise peaks therefrom, which can assist in the subsequent analysis of the frequency spectrum data.

Accordingly, the computer system 801 can identify 106 local maxima within the frequency spectrum. In one embodiment, the local maxima can be identified. Spurious peaks or local maxima can be removed using relative strength of the peaks compared to the global maximum for the frequency spectrum. For example, only the local maxima identified 106 as the peaks having an amplitude greater than or equal to a particular ratio or percentage (e.g., 10%) of the global maximum could be used for further analysis of the spectral characteristics. In another embodiment, the local maxima could be selected based on the peaks having at least a threshold amplitude. Further, the identified local maxima can be analyzed to determine which of them has the highest frequency. Accordingly, the computer system 801 can identify 108 the local maxima having the highest frequency as the first peak corresponding to the first target. In one embodiment, the first target could include water and, thus, the first peak could correspond to the water peak for the frequency spectrum.

Accordingly, the computer system 801 can convert 110 the frequency data in the frequency spectrum to a unit that is independent of magnetic field strength. In one embodiment, the computer system 801 could convert 110 the frequency data from Hz to ppm. Further, the computer system 801 can identify 112 a global maximum within a range in the converted frequency data relative to the first peak as a second peak that corresponds to the second target. In one embodiment, the second target could include fat and the second peak could correspond to the main fat peak. The range in the converted frequency data could be defined with respect to the first peak in a variety of different manners. In one embodiment, the computer system 801 could identify 112 the global maximum between −3.5 ppm±0.5 ppm from the first peak (e.g., the water peak) as the second peak (e.g., the main fat peak). Thus, in this embodiment, the range for which the global maximum is identified 112 would be between x-4.0 ppm to x-3.0 ppm relative to the first peak, where x is equal to the value of the first peak in ppm.

Accordingly, the computer system 801 can identify 114 a global minimum between the first peak and the second peak, which can be referred to as the "junction" frequency. Accordingly, the computer system 801 can determine 116 the proton spectral characteristics of the first target and the second target based on the identified values or locations of the first peak, the second peak, and the junction frequency. In addition to the chemical shift between the targets (e.g., water and fat), the offset between the peak frequencies of the targets in the spectrum for the whole MRI data volume depends on the field inhomogeneity differences between the different dominant regions for the different targets (e.g., the water-dominant and the fat-dominant regions). therefore, the offset between the targets' peak frequencies is not identical to the chemical shift between the targets, which is fixed. Accordingly, the variation in the observed junction frequency between the two targets is an indicator of the variation in spectral widths. Further, the observed spectral heterogeneity can be expected to impact the accuracy of spectral saturation methods that use fixed offsets and bandwidths for the targets. For example, if a spectral saturation method uses a fixed offset from the water peak and fixed bandwidth for fat saturating radiofrequency pulses, the accuracy of fat saturation could be sub-optimal. Information derived from the peak and junction frequencies and spectral amplitudes could be used to optimize the bandwidths of excitation and saturating radiofrequency pulses and to improve dynamic shim routines.

In one embodiment, the computer system 801 executing the process 100 can further calculate the proportions of the areas of the spectrum delineated by the junction frequency covered by different size spectral widths around the identified peaks associated with the targets. Stated differently, noting that the junction frequency lies between the first and second peaks, the junction frequency thus delineates a first area of the spectrum associated with the first peak and a second area of the spectrum associated with the second peak. Accordingly, the computer system 801 could calculate the percentage of the area of the spectrum corresponding to one or both of the peaks that is covered by the spectral width of the respective peak. For example, if the second peak lies to the "left" of the junction frequency, the computer system 801 could calculate the area of the spectrum to the left of the junction frequency that is covered by the spectral width of the second peak.

In one embodiment, the computer system 801 executing the process 100 can further calculate the full width at half maximum (FWHM) values for one or both of the peaks. The calculated FWHM values could be compared against threshold values to determine, for example, whether additional shimming should be performed. Shimming is described in U.S. Pat. No. 10,386,434, titled AUTOMATIC SHIMMING BY OPTIMIZING THE FREQUENCY ADJUSTMENT, filed Feb. 28, 2018, which is hereby incorporated by reference herein in its entirety. The width of the peaks in the spectrum is typically used as a quality criterion to determine the quality of the shim state and, in particular, FWHM values are typically used as a quantitative variable. For example, the computer system 801 could determine whether the calculated FWHM values exceed predefined thresholds. If the calculated FWHM values do exceed the predefined thresholds and the maximum number of permitted shims have not already been performed, the computer system 801 can perform shimming (or additional shimming, if shimming has already been performed) to adjust the MRI machine 830 to the subject being examined, as is described in U.S. Pat. No. 10,386,434. If shimming is performed, then the computer system 801 can repeat the steps described above and illustrated in FIG. 1. If the calculated FWHM values do not exceed the predefined thresholds and/or the maximum number of permitted shims have already been performed, the computer system 801 can determine the optimal center frequency, bandwidth, and other characteristics for, e.g., a saturation pulse corresponding to one of the target (e.g., a fat saturation pulse) based on the determined proton spectral characteristics for the targets (e.g., water and fat).

Medical Imaging System Architecture

In some embodiments, the systems and techniques described above can be implemented in or by a medical imaging system, such as the medical imaging system 800 illustrated in FIGS. 2A and 2B.

FIG. 2A is an architecture diagram of medical imaging system 800 that may be used in some embodiments. As noted above, the medical imaging system 800 can include a computer system 801 and an imaging machine 830 (e.g., an MRI machine). The computer system 801 may include one or more processors 802. Each processor 802 is connected to a communication infrastructure 806 (e.g., a communications bus, cross-over bar, or network). The processor(s) 802 can include a CPU, a GPU, an AI accelerator, and/or a variety of other processor types. Computer system 801 may include a display interface 822 that forwards graphics, text, and other data from the communication infrastructure 806 (or from a frame buffer, not shown) for display on the display unit 824.

Computer system 801 may also include a main memory 804, such as a random access memory (RAM), and a secondary memory 808. The secondary memory 808 may include, for example, a hard disk drive (HDD) 810 and/or removable storage drive 812, which may represent a floppy disk drive, a magnetic tape drive, an optical disk drive, a memory stick, or the like as is known in the art. The removable storage drive 812 reads from and/or writes to a removable storage unit 816. Removable storage unit 816 may be a floppy disk, magnetic tape, optical disk, or the like. As will be understood, the removable storage unit 816 may include a computer readable storage medium having tangibly stored therein (embodied thereon) data and/or computer software instructions, e.g., for causing the processor(s) to perform various operations.

In alternative embodiments, secondary memory 808 may include other similar devices for allowing computer programs or other instructions to be loaded into computer system 801. Secondary memory 808 may include a removable storage unit 818 and a corresponding removable storage interface 814, which may be similar to removable storage drive 812, with its own removable storage unit 816. Examples of such removable storage units include, but are not limited to, USB or flash drives, which allow software and data to be transferred from the removable storage unit 816, 818 to computer system 801.

Computer system 801 may also include a communications interface 820. Communications interface 820 allows software and data to be transferred between computer system 801 and external devices. Examples of communications interface 820 may include a modem, Ethernet card, wireless network card, a Personal Computer Memory Card International Association (PCMCIA) slot and card, or the like. Software and data transferred via communications interface 820 may be in the form of signals, which may be electronic, electromagnetic, optical, or the like that are capable of being received by communications interface 820. These signals may be provided to communications interface 820 via a communications path (e.g., channel), which may be implemented using wire, cable, fiber optics, a telephone line, a cellular link, a radio frequency (RF) link and other communication channels.

In this document, the terms "computer program medium" and "non-transitory computer-readable storage medium" refer to media such as, but not limited to, media at removable storage drive 812, a hard disk installed in hard disk drive 810, or removable storage unit 816. These computer program products provide software to computer system 801. Computer programs (also referred to as computer control logic) may be stored in main memory 804 and/or secondary memory 808. Computer programs may also be received via communications interface 820. Such computer programs, when executed by a processor, enable the computer system 801 to perform the features of the methods discussed herein. For example, main memory 804, secondary memory 808, or removable storage units 816 or 818 may be encoded with computer program code (instructions) for performing operations corresponding to various processes disclosed herein.

Referring now to FIG. 2B, the MRI machine 830 can include a magnet 850 extending along a bore that is configured to receive a patient therein and that is configured to produce a generally uniform magnetic field, one or more gradient coils 852 that are configured to produce magnetic field gradients (e.g., linear gradients), and one or more RF coils 854 that are configured to transmit to RF signals to the patient's body and/or receive RF signals therefrom. The computer system 801 (embodiments of which are described in greater detail above) can store and implement MRI data analysis algorithms 860, MRI sequences protocols 862, and/or image reconstruction algorithms 864, as well as a variety of other software modules known in the technical field. The MRI sequence protocols 862 can be embodied as instructions that, when executed by the computer system 801, cause the computer system 801 to control the gradient coils 852 and/or RF coils 854 to apply a particular sequence of magnetic field gradients and/or RF pulses to the patient. The image reconstruction algorithms 864 can be embodied as instructions that, when executed by the computer system 801, cause the computer system 801 to reconstruct an image of the patient based on the RF signal received from the patient (e.g., by the RF coils 854) as caused by the MRI sequence applied thereto. In one embodiment, the MRI data analysis algorithms 860 could include the process 100 illustrated in FIG. 1 and described above.

It is understood by those familiar with the art that the system described herein may be implemented in hardware, firmware, or software encoded (e.g., as instructions executable by a processor) on a non-transitory computer-readable storage medium.

Examples

Some examples will be provided to further illustrate application of the systems and techniques described herein. These examples are not intended to be limiting in any manner and, instead, are provided to elucidate the discussion herein.

For example, a study of the techniques described herein was performed on thirty subjects using a 3T MRI scanner (MAGNETOM Skyra, Siemens Healthcare, Erlangen, Germany). A software program was used to read frequency adjustment information in the form of an XML file from the scanner and write an ASCII file with the spectral frequency and amplitude information. Thirty different spectra were generated from the thirty subjects imaged, including twenty spectra were from the breast region, eleven from the ankle region, and nine from the knee region. It should also be noted that although the particular regions that were used in this study were the knee, breast, and ankle, the processes and techniques described herein are not limited solely to these anatomic regions. The thirty spectra saved in the ASCII files were processed using the algorithm described implemented in MATLAB. Using the algorithm, the spectral characteristics (i.e., water, fat peak frequency, and junction frequency) of their various regions were determined.

Figure 3:
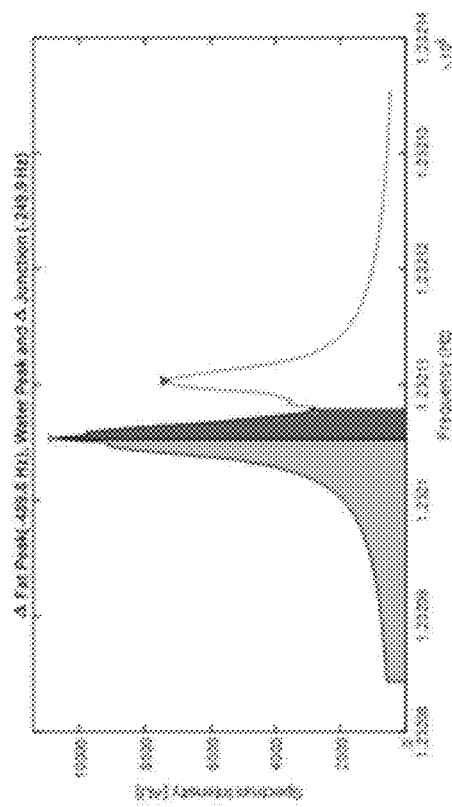
FIG. 3 is a set of spectra for representative individuals demonstrating the spectral heterogeneity between and among the knee, breast, and ankle regions, in accordance with at least one aspect of the present disclosure.
Figure 4:
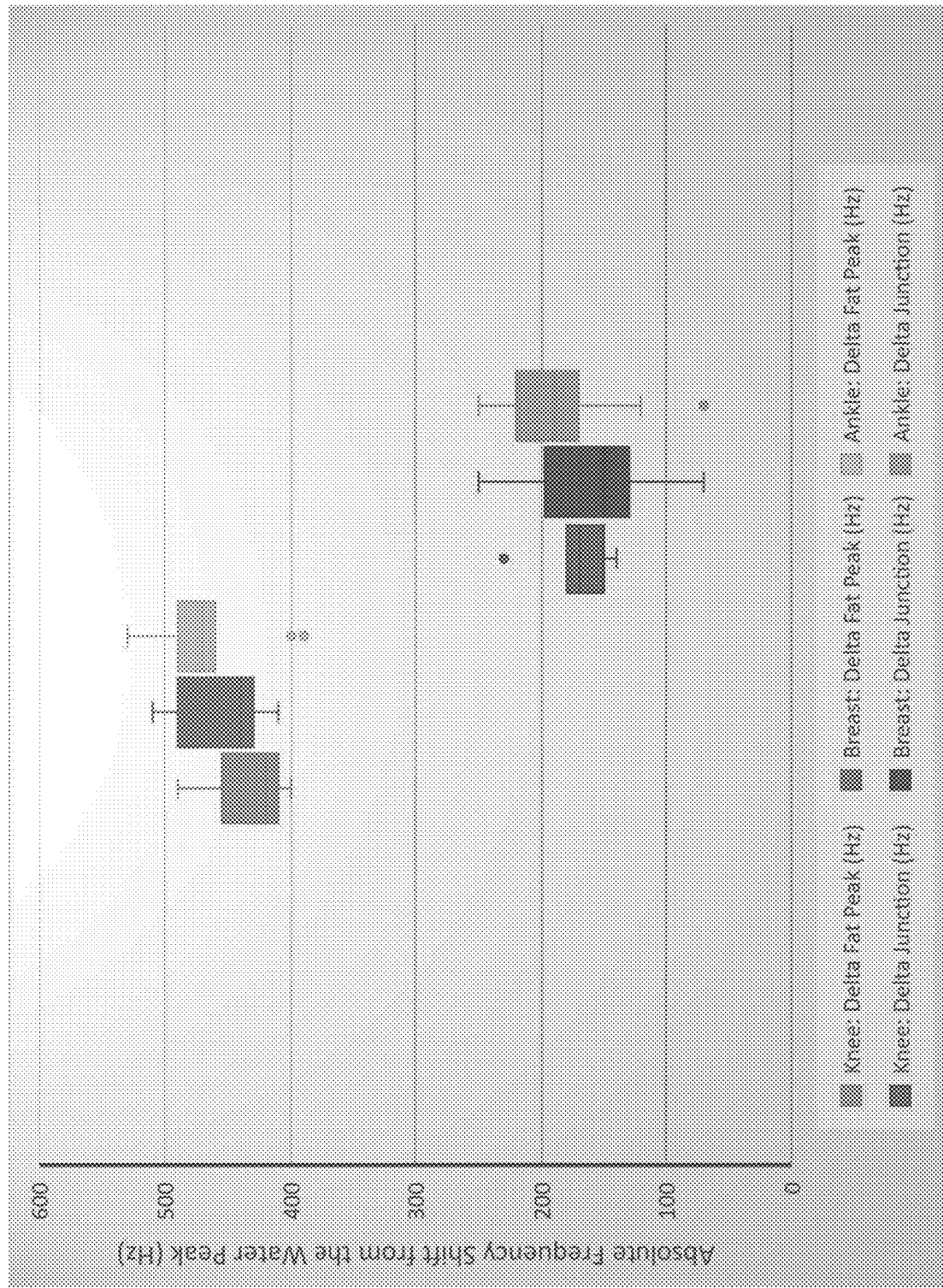
FIG. 4 is a set of box-and-whisker plots demonstrating the frequency difference between the water and main fat peaks for the spectra for the knee, breast, and ankle regions, in accordance with at least one aspect of the present disclosure.

FIG. 3 demonstrates the performance of the algorithm on representative spectra from the breast, ankle, and knee regions, which exhibits clear spectral heterogeneity between and among the aforementioned regions. In particular, FIG. 3 provides the spectra from a representative cohort of subjects (i.e., six out of the total of thirty subjects) in the study. As can be seen, the representative spectra demonstrate the spectral heterogeneity between and among the regions of knee, breast, and ankle. Notably, the illustrated proton spectra are from the complete imaging volume, i.e., the complete MRI data volume. As can also be seen, the offset between the water and fat peak frequencies in the spectrum for the whole imaging volume depends on the field inhomogeneity differences between the fat-dominant and water-dominant regions, as generally described above. FIG. 4 demonstrates the frequency differences between the peaks associated with the different targets (which were fat and water in this particular example) and the frequency differences between a target peak (which was the water peak in this particular example) and the junction frequency. In particular, the box-and-whisker plots in FIG. 4 demonstrate the frequency difference between the water and main fat peaks (referred to as "Delta Fat Peak") for the complete imaging volume proton spectra from the knee (number of subjects n=9), breast (n=20), and ankle (n=11) regions. The box-and-whisker plots in FIG. 4 also demonstrate the frequency difference between the water peak and the junction frequency (referred to as "Delta Junction") from the knee, breast, and ankle regions. The results show the impact of field homogeneity on the spectra in different anatomical regions. In general, the spectral heterogeneity observed shows the impact of field homogeneity on the water and the main fat peak frequency, as well as the spectral widths in different anatomical regions.

In sum, the systems and processes described herein were successful in identifying proton spectral characteristics in the subjects. Accordingly, the systems and methods described herein could be used for determining accurate spectral fat saturation, improving dynamic shim routines, and optimizing bandwidth of radiofrequency pulses used in multi-slice or multi-band excitation. Therefore, these techniques have a broad range of applicability across the MRI field.

While various illustrative embodiments incorporating the principles of the present teachings have been disclosed, the present teachings are not limited to the disclosed embodiments. Instead, this application is intended to cover any variations, uses, or adaptations of the present teachings and use its general principles. Further, this application is intended to cover such departures from the present disclosure that are within known or customary practice in the art to which these teachings pertain.

In the above detailed description, reference is made to the accompanying drawings, which form a part hereof. In the drawings, similar symbols typically identify similar components, unless context dictates otherwise. The illustrative embodiments described in the present disclosure are not meant to be limiting. Other embodiments may be used, and other changes may be made, without departing from the spirit or scope of the subject matter presented herein. It will be readily understood that various features of the present disclosure, as generally described herein, and illustrated in the Figures, can be arranged, substituted, combined, separated, and designed in a wide variety of different configurations, all of which are explicitly contemplated herein.

Aspects of the present technical solutions are described herein with reference to flowchart illustrations and/or block diagrams of methods, apparatuses (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present technical solutions. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action can be said to be "in response to" a first action independent of whether the second action results directly or indirectly from the first action. The second action can occur at a substantially later time than the first action and still be in response to the first action. Similarly, the second action can be said to be in response to the first action even if intervening actions take place between the first action and the second action, and even if one or more of the intervening actions directly cause the second action to be performed. For example, a second action can be in response to a first action if the first action sets a flag and a third action later initiates the second action whenever the flag is set.

The present disclosure is not to be limited in terms of the particular embodiments described in this application, which are intended as illustrations of various features. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," et cetera). While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention.

In addition, even if a specific number is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, sample embodiments, or drawings, should be understood to contemplate the possibilities of including one of the terms, either of the terms, or both terms. For example, the phrase "A or B" will be understood to include the possibilities of "A" or "B" or "A and B."

In addition, where features of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, et cetera. As a non-limiting example, each range discussed herein can be readily broken down into a lower third, middle third and upper third, et cetera. As will also be understood by one skilled in the art all language such as "up to," "at least," and the like include the number recited and refer to ranges that can be subsequently broken down into subranges as discussed above. Finally, as will be understood by one skilled in the art, a range includes each individual member. Thus, for example, a group having 1-3 components refers to groups having 1, 2, or 3 components. Similarly, a group having 1-5 components refers to groups having 1, 2, 3, 4, or 5 components, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A computer-implemented method for determining proton spectral characteristics of a first target and a second target from an MRI data volume, the method comprising:
    determining, by a computer system, a frequency spectrum for the MRI data volume;
    identifying, by the computer system, local maxima within the frequency spectrum;
    identifying, by the computer system, the local maxima having a highest frequency as a first peak corresponding to the first target;
    converting, by the computer system, frequency data of the frequency spectrum to a unit independent of magnetic field strength;
    identifying, by the computer system, a global maximum within a range in the converted frequency data relative to the first peak as a second peak corresponding to the second target;
    identifying, by the computer system, a global minimum between the first peak and the second peak as the junction frequency; and
    determining, by the computer system, the proton spectral characteristics of the first target and the second target based on the identified first peak, the identified second peak, and the identified junction frequency.

2. The method of claim 1, wherein the first target comprises water, the first peak comprises a water peak, the second target comprises fat, and the second peak comprises a main fat peak.

3. The method of claim 1, wherein the magnetic-field independent unit comprises ppm.

4. The method of claim 1, further comprising:
    determining, by the computer system, a full width at half maximum (FWHM) value for at least one of the first peak or the second peak;
    comparing, by the computer system, the FWHM value for the first peak or the second peak to a threshold; and
    determining, by the computer system, whether to perform shimming based on the comparison of the FWHM value for the first peak or the second peak to the threshold.

5. The method of claim 4, further comprising:
    determining, by the computer system, whether a maximum number of shims have been performed;
    wherein determining, by the computer system, whether to perform the shimming is further based on the maximum number of shims have been performed.

6. The method of claim 4, further comprising:
    determining, by the computer system, a characteristic for a saturation pulse to suppress the second target based on the determined proton spectral characteristics of the first target and the second target.

7. The method of claim 6, wherein the characteristic for the saturation pulse comprises at least one of an optimal center frequency or a bandwidth for the saturation pulse.

8. A computer system for determining characteristics of water and fat proton spectra for an MRI data volume, the computer system comprising:
    a processor; and
    a memory coupled to the processor, the memory storing instructions that, when executed by the processor, cause the computer system to:
        determine a frequency spectrum for the MRI data volume;
        identify local maxima within the frequency spectrum;
        identify the local maxima having a highest frequency as a first peak corresponding to the first target;
        convert frequency data of the frequency spectrum to a unit independent of magnetic field strength;
        identify a global maximum within a range in the converted frequency data relative to the first peak as a second peak corresponding to the second target;
        identify a global minimum between the first peak and the second peak as the junction frequency; and
        determine the proton spectral characteristics of the first target and the second target based on the identified first peak, the identified second peak, and the identified junction frequency.

9. The computer system of claim 8, wherein the first target comprises water, the first peak comprises a water peak, the second target comprises fat, and the second peak comprises a main fat peak.

10. The computer system of claim 8, wherein the magnetic-field independent unit comprises ppm.

11. The computer system of claim 8, wherein the memory further stores instructions that, when executed by the processor, cause the computer system to:
    determine a full width at half maximum (FWHM) value for at least one of the first peak or the second peak;
    compare the FWHM value for the first peak or the second peak to a threshold; and
    determine whether to perform shimming based on the comparison of the FWHM value for the first peak or the second peak to the threshold.

12. The computer system of claim 11, wherein the memory further stores instructions that, when executed by the processor, cause the computer system to:
    determine whether a maximum number of shims have been performed; and
    wherein the determination of whether to perform the shimming is further based on the maximum number of shims have been performed.

13. The computer system of claim 11, wherein the memory further stores instructions that, when executed by the processor, cause the computer system to:
  determine a characteristic for a saturation pulse to suppress the second target based on the determined proton spectral characteristics of the first target and the second target.

14. The computer system of claim 13, wherein the characteristic for the saturation pulse comprises at least one of an optimal center frequency or a bandwidth for the saturation pulse.

15. A computer readable medium storing instructions that, when executed by a processor, cause a computer system to:
  determine a frequency spectrum for the MRI data volume;
  identify local maxima within the frequency spectrum;
  identify the local maxima having a highest frequency as a first peak corresponding to the first target;
  convert frequency data of the frequency spectrum to a unit independent of magnetic field strength;
  identify a global maximum within a range in the converted frequency data relative to the first peak as a second peak corresponding to the second target;
  identify a global minimum between the first peak and the second peak as the junction frequency; and
  determine the proton spectral characteristics of the first target and the second target based on the identified first peak, the identified second peak, and the identified junction frequency.

* * * * *